(12) United States Patent
Price et al.

(10) Patent No.: US 10,163,667 B2
(45) Date of Patent: Dec. 25, 2018

(54) LINEAR WAFER DRIVE FOR HANDLING WAFERS DURING SEMICONDUCTOR FABRICATION

(75) Inventors: J. B. Price, Los Gatos, CA (US); Jed Keller, Los Gatos, CA (US); Laurence Dulmage, Nevada City, CA (US); David Adams, Belmont, CA (US); Eric Winger, Campbell, CA (US); Lawrence Wise, Mountain View, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 1991 days.

(21) Appl. No.: 12/054,160

(22) Filed: Mar. 24, 2008

(65) Prior Publication Data

US 2008/0232934 A1 Sep. 25, 2008

Related U.S. Application Data

(60) Provisional application No. 60/896,371, filed on Mar. 22, 2007.

(51) Int. Cl.
*B65G 29/00* (2006.01)
*H01L 21/67* (2006.01)
*H01L 21/677* (2006.01)

(52) U.S. Cl.
CPC .. *H01L 21/67196* (2013.01); *H01L 21/67161* (2013.01); *H01L 21/67276* (2013.01); *H01L 21/67742* (2013.01)

(58) Field of Classification Search
CPC ...................................................... B65G 29/00

USPC ............................................. 414/752.1, 744.5
See application file for complete search history.

(56) References Cited

U.S. PATENT DOCUMENTS

| | | |
|---|---|---|
| 5,389,793 A | 2/1995 | Aitken et al. |
| 6,103,055 A | 8/2000 | Maher et al. |
| 7,108,476 B2 * | 9/2006 | Astegno .............. H01L 21/6835 |
| | | 414/416.01 |
| 7,334,826 B2 * | 2/2008 | Woodruff et al. ......... 294/103.1 |
| 2002/0033136 A1 | 3/2002 | Savage et al. |
| 2002/0108714 A1 | 8/2002 | Doering et al. |
| 2003/0182012 A1 | 9/2003 | Yamauchi et al. |
| 2005/0120578 A1 | 6/2005 | Van der Meulen |
| 2005/0194096 A1 | 9/2005 | Price et al. |

FOREIGN PATENT DOCUMENTS

| | | |
|---|---|---|
| JP | 10309689 | 11/1998 |
| JP | 2004214689 A | 7/2004 |
| JP | 2004342638 | 12/2004 |
| JP | 2005019967 A | 1/2005 |
| JP | 2006238540 | 9/2006 |
| WO | PCT/US2009/-58049 | 11/2008 |

\* cited by examiner

*Primary Examiner* — Saul Rodriguez
*Assistant Examiner* — Willie Berry, Jr.
(74) *Attorney, Agent, or Firm* — Martine Penilla Group, LLP

(57) ABSTRACT

A modular cluster tool is disclosed. According to one embodiment, a system, comprises a wafer transfer station that includes a first vacuum chamber that stores a plurality of semiconductor wafers. The system also includes an equipment front end module interface, and two or more shuttle lock interfaces.

18 Claims, 10 Drawing Sheets

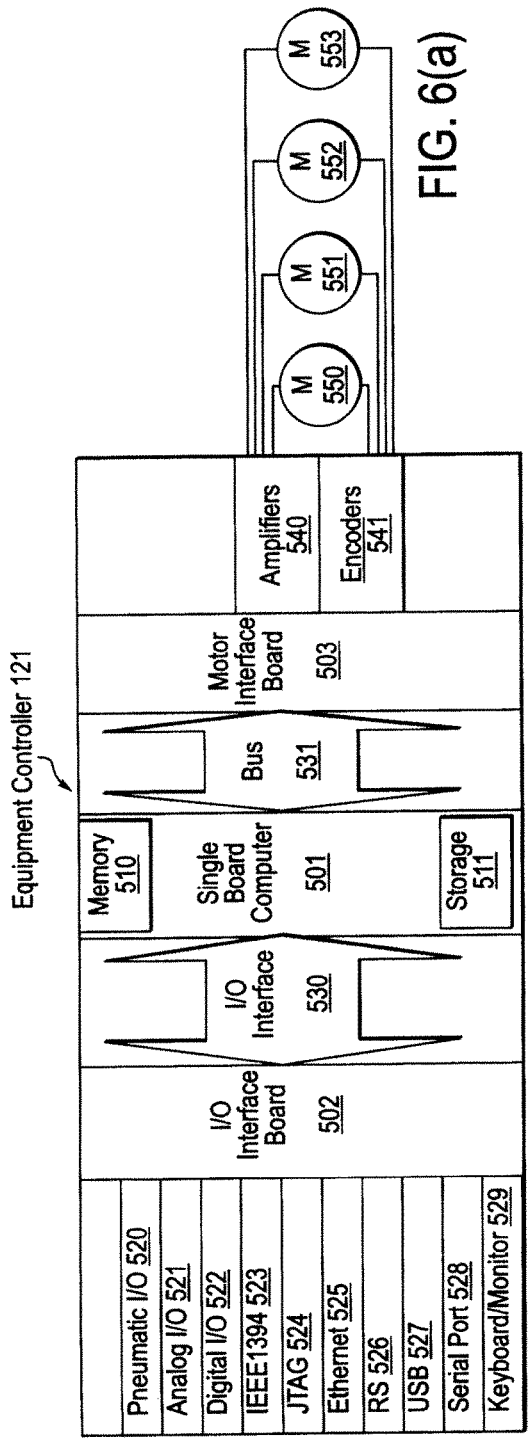
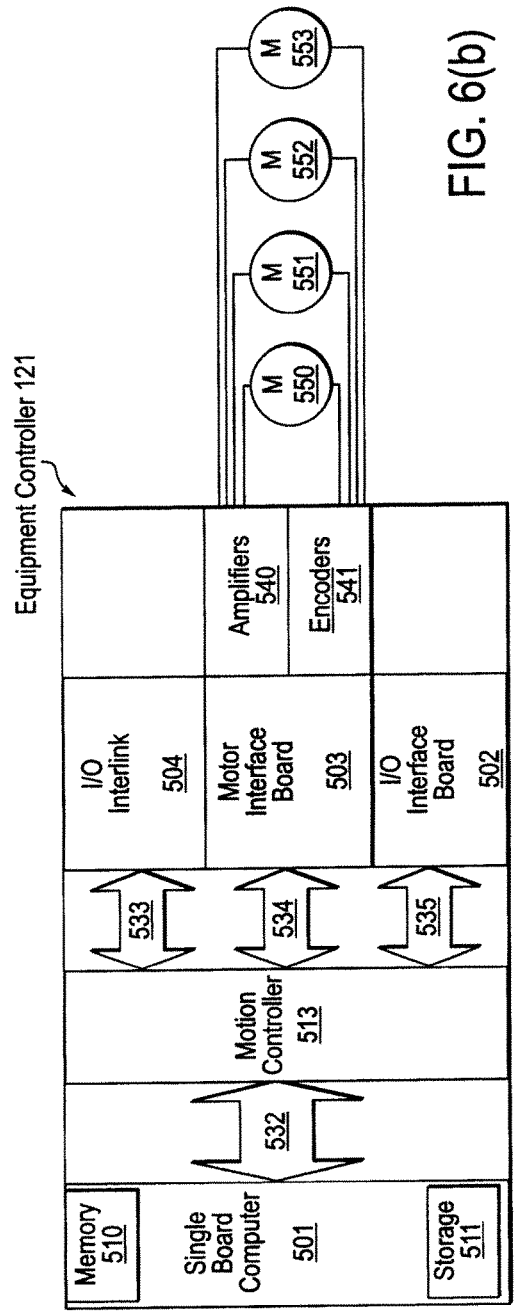

LINEAR WAFER DRIVE FOR HANDLING WAFERS DURING SEMICONDUCTOR FABRICATION

The present application claims the benefit of and priority to U.S. Provisional Patent Application No. 60/896,371 filed on Mar. 22, 2007, which is hereby incorporated by reference in its entirety.

FIELD

The field of the invention relates generally to semiconductor manufacturing equipment and pertains particularly to a modular cluster tool with distributed motion.

BACKGROUND

Semiconductor substrate processing is typically performed by subjecting a substrate to a plurality of sequential processes to create devices, conductors and insulators on the substrate. Semiconductor manufacturing processes are generally performed in a processing chamber configured to perform a single step of the production process. In order to efficiently complete a sequence of processing steps, a number of processing chambers is typically coupled to a central transfer chamber that houses one centrally located robot to facilitate transfer of the substrate between the processing chambers. A semiconductor processing platform having this configuration is generally known as a cluster tool, examples of which are the family of CENTURA® and ENDURA® processing platforms available from Applied Materials, Inc. of Santa Clara, Calif.

Generally, a cluster tool consists of a central transfer chamber having one or more robots disposed therein. The transfer chamber is typically surrounded by one or more processing chambers, and at least one load-lock chamber. The processing chambers are generally utilized to process the substrate, for example, performing various processing steps such as etching, physical, vapor deposition, chemical vapor deposition, and the like. Processed and unprocessed substrates are housed in substrate storage cassettes, also known as FOUPs, disposed in a factory interface coupled to the load-lock chamber.

The load-lock chamber is isolated from the factory interface and the transfer chamber by slit valves. Substrates enter the transfer chamber from the substrate storage cassettes one at a time through the load-lock. The substrate is first positioned in the load-lock after the substrate is removed from the cassette. The load-lock is then sealed and pumped down to match the operating pressure of the substrate transfer chamber. The slit valve between the load-lock and transfer chamber is then opened, allowing the substrate transfer robots to access the substrates disposed in the load-lock. In this fashion, substrates may be transferred into and out of the transfer chamber without having to repeatedly re-establish transfer chamber vacuum levels after each substrate passes through the load-lock or processing chambers.

SUMMARY

A modular cluster tool is disclosed. According to one embodiment, a system comprises a wafer transfer station that includes a first vacuum chamber that stores a plurality of semiconductor wafers. The system also includes an equipment front end module interface, and two or more shuttle lock interfaces.

Advantages of the invention will be set forth in part in the description which follows and in part will be obvious from the description or may be learned by practice of the invention. The objects and advantages of the invention will be realized and attained by means of the elements and combinations particularly pointed out in the appended claims and equivalents.

BRIEF DESCRIPTION OF THE DRAWINGS

The accompanying drawings, which are included as part of the present specification, illustrate embodiments of the present invention, and together with the general description given above and the detailed description of the embodiments given below serve to explain and teach the principles of the present invention.

FIGS. 6(a) and 6(b) illustrate a block diagram of an exemplary equipment controller, according to one embodiment;

DETAILED DESCRIPTION

Figure 1:
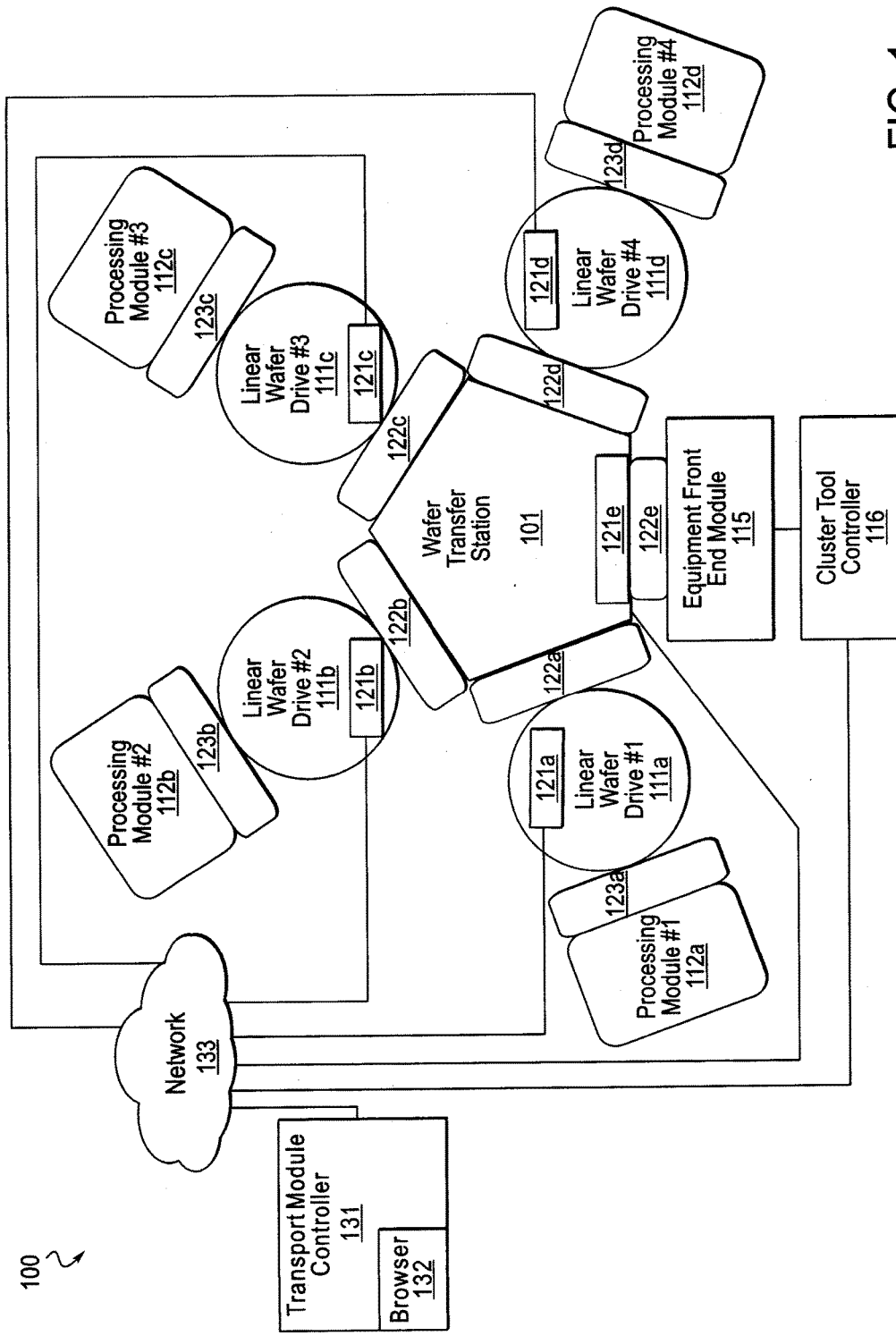
FIG. 1 illustrates a block diagram of an exemplary modular semiconductor cluster tool, according to one embodiment.

A modular cluster tool is disclosed. According to one embodiment, a system, comprises a wafer transfer station that includes a first vacuum chamber that stores a plurality of semiconductor wafers. The system also includes an equipment front end module interface, and two or more shuttle lock interfaces.

In the following description, for purposes of explanation, specific nomenclature is set forth to provide a thorough understanding of the present invention. However, it will be apparent to one skilled in the art that these specific details are not required in order to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic, signals capable of being stored, transferred, combined, compared, and otherwise manipulated. It has proven convenient at times, principally for reasons of common usage, to refer to these signals as bits, values, elements, symbols, characters, terms, numbers, commands or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing," "computing," "calculating," "determining," "displaying" or the like, refer to the action and processes of a computer system, or similar electronic computing device, that manipulates and transforms data represented as physical (electronic) quantities within the computer system's, registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer-readable storage medium, such as, but is not limited to, any type of disk including floppy disks, optical disks, CD-ROMs, and magnetic-optical disks, read-only memories (ROMs), random access memories (RAMs), EPROMs, EEPROMs, FLASH memories, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

FIG. 1 illustrates a block diagram of an exemplary modular semiconductor cluster tool, according to one embodiment. Four linear wafer drives 111a-111d and an EFEM 115 are connected to a wafer transfer station 101 via slot valves 122a-122e. Each linear wafer drive 111a-111d is also connected to a processing module 112 via slot valves 123. According to one embodiment, a linear wafer driver is dedicated to each process module. Linear wafer drives 111 are external to and isolated from the connected processing modules 112 and the wafer transfer station 101. The processing modules 112 are utilized to process wafers, for example, etching, physical vapor deposition, chemical vapor deposition, rapid thermal processing and cleaning. The EFEM 115 loads a set of wafers and transfers it into wafer transfer station 101 through slot valve 122e. After the set of wafers is loaded into the wafer transfer station 101, the slot valve 122e is closed and the air within the chamber of the wafer transfer station 101 is pumped out to reach a desired vacuum level. Slot valves 122 of linear wafer drives 111 that are at a different vacuum level from that of wafer transfer station 101 remain closed until the vacuum levels reach a specified level. According to another embodiment, processing modules 122 may require different vacuum levels, processing times, and processing orders. Once the desired vacuum level is reached, one or more slot valves 122 are opened to transfer wafers into one or more linear wafer drives 111a-111d. Under certain circumstances, only one linear wafer drive is opened to access the wafer transfer station 101 when the cross-contamination issue arises depending on the nature of the wafer processing. The wafers are subsequently transferred to one or more processing modules 112a-112d after the vacuum levels of the processing module and the linear wafer drive match. Other environmental conditions may also be met such as the temperature, humidity, and dust concentration.

Once the transfer operation of the wafers is carried out, the slot valves 122 and 123 are closed to start the operation of the processing modules 112. While the processing modules 112 are being operated, the linear wafer drives 111 can prepare for the next process or reach out to the wafer transfer station 101 to load/unload other wafers.

According to one embodiment, linear wafer drives 111, slot valves 122 and 123, and wafer transfer station 101 are controlled by the transport module controller 131 while the operations of processing modules 112 and EFEM 115 are controlled by cluster tool controller 116.

According to one embodiment, a command to transfer wafer #1 from processing module 112b to linear wafer drive 111b is initiated by cluster tool controller 116. The command is delivered to transport module controller 131 via network 133. A motion request associated with the command is generated and placed into the incoming command queue of transport module controller 131. Each incoming command is stored in a command queue and prioritized depending on its severity and criticality. The priority of the command is also dependent on the current status of the cluster tool: for example, if the vacuum levels of processing module 112b and linear wafer drive 111b are not equal, then a vacuum control command is inserted before the motion request to ensure safe wafer transfer between the two vacuum chambers. Even if the vacuum level is cross-checked, the motion command may or may not proceed. For example, the vacuum sensors of linear wafer drive 111b or processing module 112b might be malfunctioning, in which case the motion request eventually times out and a system error is posted to stop further operation and to warn the operator. If the error is identified as recoverable, a safety check is performed and the transport module controller 131 tries to recover the error without human interference. Depending on the severity of the system error, the subsequent motion command may or may not be performed. According to one embodiment, system status is checked on a separate thread from the motion commands on transport module controller 131 for an elevated safety measure. After the motion request is performed, the status is updated and is relayed from transport module controller 131 to cluster tool controller 116.

According to one embodiment, network 133 is an Ethernet network connecting components of system 100, namely, equipment controllers 121, transport module controller 131, EFEM 115, and cluster tool controller 116. According to another embodiment, network 133 is a distributed network, a bus network enabling communication between each network component. For example, network 133 is an Ethernet-based network or the like, which connects network components by using a network switch. In such packet-based networks, each network component is configured as a node that receives and transmits command packets with a designator. When the designator matches with the network node ID of the receiving node, the command is intercepted and processed. If the designator is not found or the command within a packet is unknown, an error is posted on the network.

According to one embodiment, transport module controller 131 runs a browser 132 for interactively communicating with the operator of the system. Browser 132 presents a user interface (UI) so that the operator of system 100 configures, monitors, and checks the status of the system when needed. Configuration menus may be used to configure the number of linear drives; the type of processing modules connected to the linear drives, the types and numbers of I/Os; environmental constraints for the processing modules, error logging capabilities; the teaching points of rotational and linear drives; the acceleration, deceleration and speed of motion profiles. The UI also provides a detailed status of the system components and sensors.

Cluster tool system 100 of FIG. 1 is modular without the need for a central robot so that wafer transfer station 101 and linear wafer drives 111 are used as building blocks to construct a custom system. The system software allows for the expansion or reconfiguration of the system using the configuration tool provided by the system software. Rotational drives and linear drives are separated in the wafer transfer station and linear wafer drives, so that the motion control becomes simpler by reducing pick-and-place conflicts. In addition, the present modular design greatly increases the throughput of system 100 by allowing access to multiple linear wafer drives with multiple wafer queues, thus to multiple processing chambers simultaneously.

The modular design of the present system offers additional advantages. Field upgrades are easier because the modules are designed to be swappable and reconfigurable in the field. Therefore, the system downtime is shorter during the routine maintenance, repairs, or upgrades.

Motion profiles and the control algorithms for drives are optimized for the fastest throughput without sacrificing stability and robustness. The core drives can be swapped without redesigning the whole drive mechanism, which is impossible with SCARA robots or any other wafer handling robots where the motion axes are coupled together.

According to one embodiment, a linear drive 111 may be fitted with an in-situ metrology tester to test the result of the adjacent process and collect statistical data for further analysis. The test results are fed back to a yield management system where the patterns of faults or improvements are monitored and analyzed and, if necessary, the results are used to fine-tune the system parameters to improve the performance of the processing modules.

Figure 2:
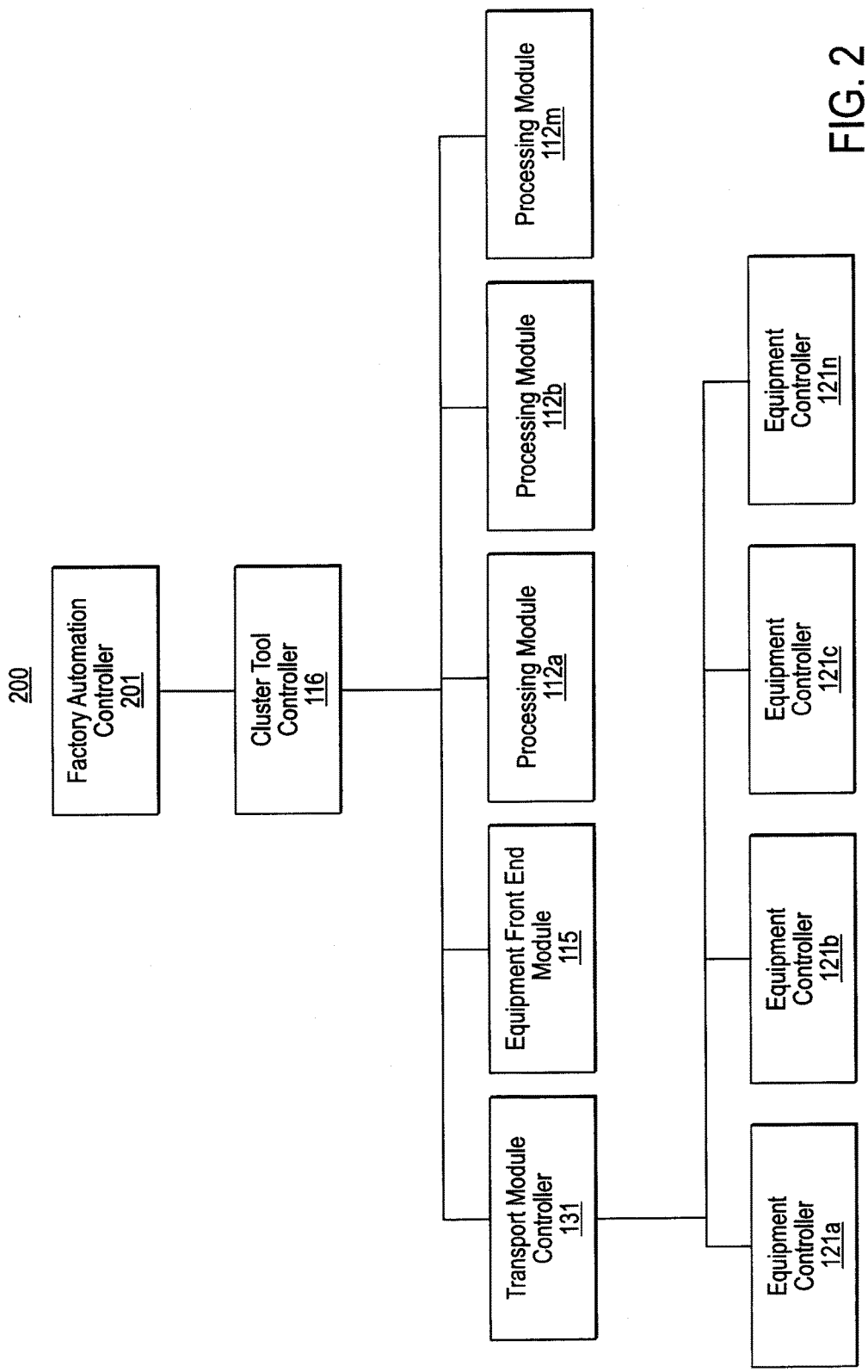
FIG. 2 illustrates an exemplary hierarchical architecture of a modular cluster tool system, according to one embodiment.

FIG. 2 illustrates an exemplary hierarchical architecture of a modular cluster tool system 100, according to one embodiment. A semiconductor factory automation controller 201 is responsible for the seamless operation of semiconductor equipment in a fab including a collection of cluster tools, stockers, automatic guide vehicles, test equipments and fabrication equipments. The vast majority of semiconductor factory automation standards is issued by the Semiconductor Equipment Manufacturers Institute (SEMI). These standards are commonly known as the SEMI SECS/GEM standards.

A cluster tool controller 116 is responsible for the operation of one or more EFEMs 115 to load/unload wafer cassettes and one or more transport module controllers 131 to move wafers within the cluster tool. An EFEM 115 is designed to interface with various semiconductor processing equipments and back-end systems, typically wafer loading/unloading stations. A transport module controller 131 controls the operations of one or more equipment controllers 121 of modular cluster tool system 100. Each equipment controller 121 controls, according to one embodiment, either wafer transfer station 101 or linear wafer drive 111.

The present modular cluster tool system 100 may be integrated into an existing fab as a new subsystem or as a replacement of an existing cluster tool. Transport module controller 131 receives scheduling commands from cluster tool controller 116 and distributes the commands to multiple equipment controllers 121 connected via network 133. Each of equipment controllers 121 controls a modular cluster tool component such as wafer transfer station 101 or linear wafer driver 111. In a similar fashion, the status of each equipment controller 121 is reported back to transport module controller 131. Transport module controller 131 analyzes and processes the status of the equipment controllers connected thereto in light of newly arrived commands and collectively reports to cluster tool controller 116. For example, if a command to move an unprocessed wafer to processing module 112a arrives, transport module controller 131 checks the status of the attached linear wafer driver 111a to ensure that the processing module 112a is in a ready state to process a new wafer. The vacuum level of linear wafer drive 111a was well as the status of slit valves 122a and 123a are cross-checked to see if linear wafer drive 111a is also in a ready state to accept a new wafer. If the command cannot be immediately processed, the status of linear wafer drive 111a is reported as "in progress" and the command is queued for later processing. It is noted that the actual software implementation of transport module controller 131 to process commands and report status may vary without deviating from the scope of the present invention. Using the status information reported from EFEM 115 and processing modules 112 as well as transport module controller 131, cluster tool controller 116 overviews the operation of each individual modular cluster tool component and controls then from a system level to enhance the overall performance of the modular cluster tool system 100.

According to one embodiment, transport module controller 131 is compatible with a factory automation protocol that cluster tool controller 116 complies with. The integration of a new cluster tool system 100 into an existing fab is facilitated by configuring transport module controller 131, since all the communication between the existing cluster tool controller 116 and multiple equipment controller 121 is routed through transport module controller 131. This way the firmware and/or software residing on each equipment controller 121 does not have to be reconfigured to communicate with cluster tool controller 116, whose communication protocol may vary from fab to fab and/or client to client.

According to another embodiment, there is no physical transport module controller 131. Instead, the functionalities of transport module controller 131 are embedded into either cluster tool controller 116 or individual equipment controller 121. According to yet another embodiment, transport module controller 131 is provided by a client and each equipment controller 121 requires, to some extent, configuration to work with the transport module controller 131. For the ease of integration in either configuration, the firmware (or software) of transport module controller 131 may be provided in a format that can be easily integrated with the firmware (or software) of equipment controllers 121 or cluster tool controller 116. For example, the software of transport module controller 131 or equipment controller 121 is a Microsoft Windows application. In the absence of transport module controller 131, a portion of or the entire transport module controller 131 firmware is loaded into equipment controller 121 as an extra module. Alternatively, a portion of or the entire the transport module controller 131's firmware may be loaded into cluster tool controller 116.

Linear wafer drives 111 have dual independent linear drives to transfer wafers to and from processing module 112 and wafer transfer station 101 simultaneously, thereby increasing the throughput of the system. According to one embodiment, the dual independent linear drives are piezoelectric motors. According to another embodiment, the dual independent linear drives are DC linear motors, step motors, or the like depending on the specifications of the design. For some applications, piezoelectric motors, also known as piezoelectric ultrasonic motors (PUMs), are advantageous over other linear drive mechanisms; the design is simple, thus it is light and the form factor is small enough to fit into a compact design. While providing high-precision control, the piezoelectric motor is intrinsically stable, thus a simpler yet robust motion control scheme can be adopted. A piezoelectric motor possesses high friction when static, therefore it includes the function of a natural mechanical brake when the supply voltage drops below the threshold voltage. A simpler deceleration motion profile can be utilized to stop the motion at the end of a motion cycle. It is understood that the present embodiments are not limited to a particular type of linear drive.

Figure 3A:
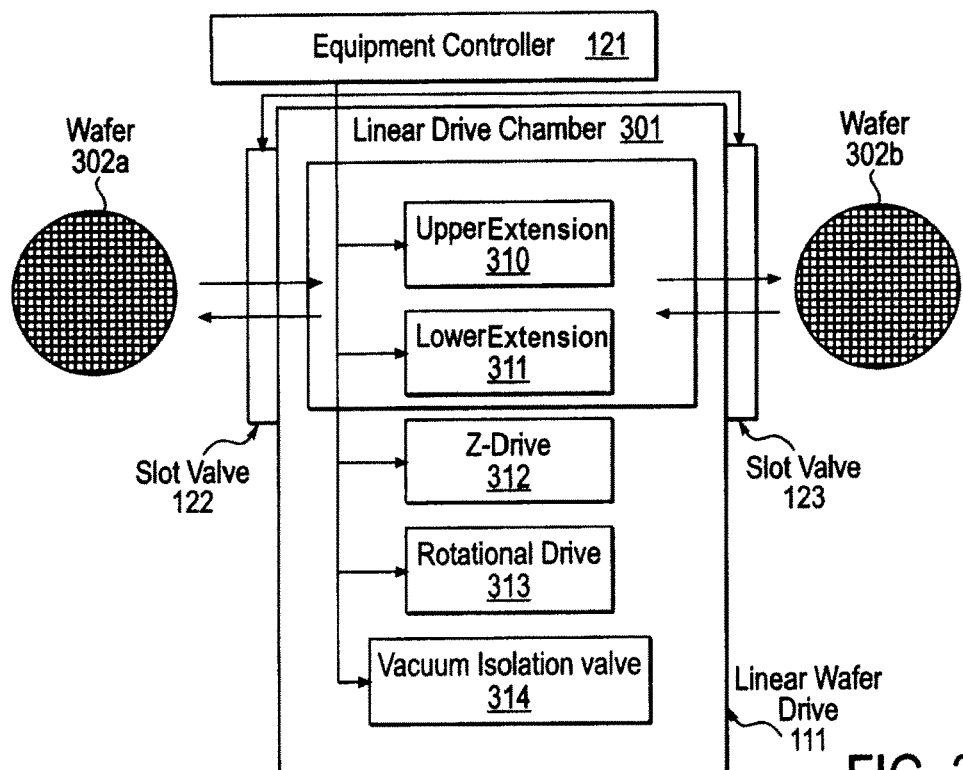
FIG. 3(a) illustrates a block diagram of an exemplary linear wafer drive, according to one embodiment.

FIG. 3(a) illustrates a block diagram of an exemplary linear wafer drive 111, according to one embodiment. According to one embodiment, a linear wafer drive 111 may exist within a shuttle lock. The linear wafer drive 111 has chamber 30 that houses upper extension 310 and lower extension 311, Z-drive 312, rotational drive 313 and vacuum isolation unit 314. The linear drive chamber 301 provides vacuum conditions while transferring wafers 302 to and from the attached modules such as processing modules or wafer transfer stations through slot valves 122 and 123. The upper extension 310 and lower extension 311 provide two independent linear degrees of freedom. Since upper extension 310 and lower extension 311 are independently controlled and operated, linear drive 111 can transfer wafer 302a without being affected by the location and the operation of wafer 302b, or vice versa. They are mounted atop the assembly of Z drive 312 and rotational drive 313, which provide not only 180° of rotational degrees of freedom but also a Z-directional movement. The interfaces to wafers 302 on the attached modules may be fixed at different heights, therefore Z-drive 312 is required to adjust the height of the dual extensions 310 and 311 when accessing the wafers 302. According to one embodiment, upper extension 310 and lower extension 311 extend their arms only in one direction, thus can access wafers from only one side. When accessing a wafer on the other side, rotational drive 313 rotates the dual extensions 310 and 311 by 180 degrees to provides an access to the wafer. According to one embodiment, the dual extensions 310 and 311 may require different lengths of strokes and/or access heights to reach wafers 302 from and to the attached modules. The fine adjustment of the configuration-dependent setup is done during the configuration of the system described earlier. For example, teach (or index) points, critical points in the path of a motion, need to be taught during this configuration process of the linear drive 111. Teach points typically include end positions in a linear stroke defining the start and end of the motion, and some intermediate positions to define and control complex motions such as turning points, transition points, etc. that require accurate position control. The equipment controller 121, in accordance with one embodiment, can control up to four axes namely, upper extension 310, lower extension 311, Z-drive 312 and rotational drive 313. Linear drive chamber 301 is a vacuum chamber. Vacuum condition within the chamber 301 is controlled by vacuum isolation valves 314 controlled by equipment controller 121.

Since the rotational and Z axes are mechanically separated from one another, the motion control for each axis is relatively simple compared to conventional wafer handling robots, which combine both rotational and Z drives According to one embodiment, Z-drive 312 and rotational drive 313 are positioned outside of the linear drive chamber 301. A ferro-fluidic seal or any other type of seals may be used around the vertical shaft of Z-drive 312 to isolate the linear drive chamber 301 from atmospheric pressure and the attached processing module 112 and wafer transfer station 101. The placement of Z-drive 132 and rotational drive 313 outside linear drive chamber 301 is advantageous in many respects; linear drive chamber 301 is made smaller so that the time to regulate the chamber 301's pressure is shortened, and less particles are generated within the chamber. Since the size of linear drive chamber 301 is reduced, a cost advantage for building linear wafer drives 111 is achieved.

Figure 3B:
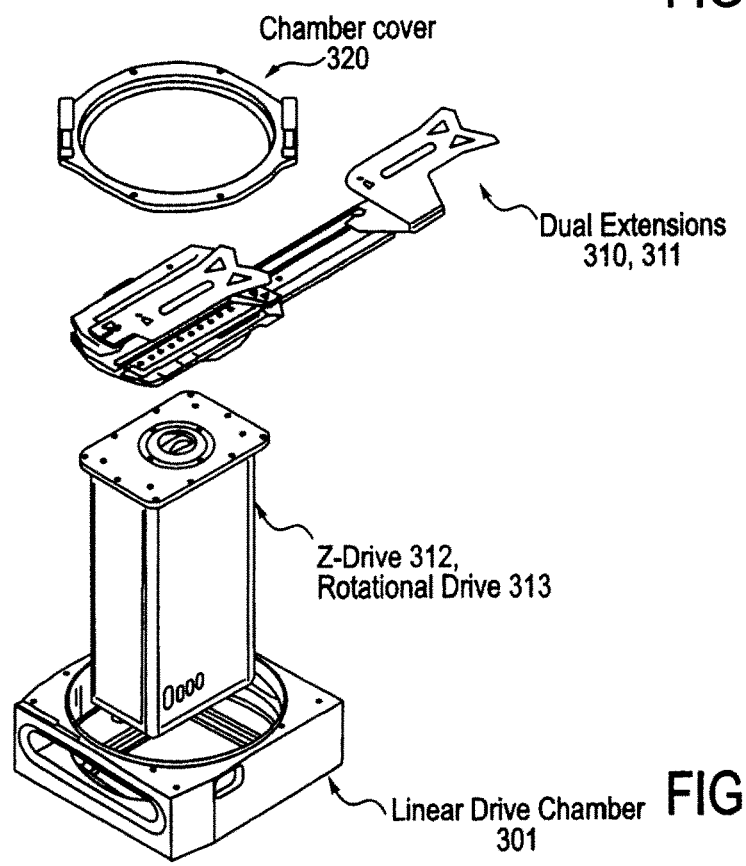
FIG. 3(b) illustrates an exemplary linear wafer drive, according to one embodiment.

FIG. 3(b) illustrates an exemplary linear wafer drive, according to one embodiment. Dual wafer extensions 310 and 311 are located inside of linear drive chamber 301 whereas Z-drive 312 and rotational drive 313 are positioned outside of linear drive chamber 301 for the reason discussed above. Linear drive chamber 301 has an opening on the top side sealed with chamber cover 320 to facilitate an access to the inside of linear drive chamber 301. The topside opening is covered with a lid (not shown) to close the vacuum seal for linear driver chamber 301.

Figure 4:
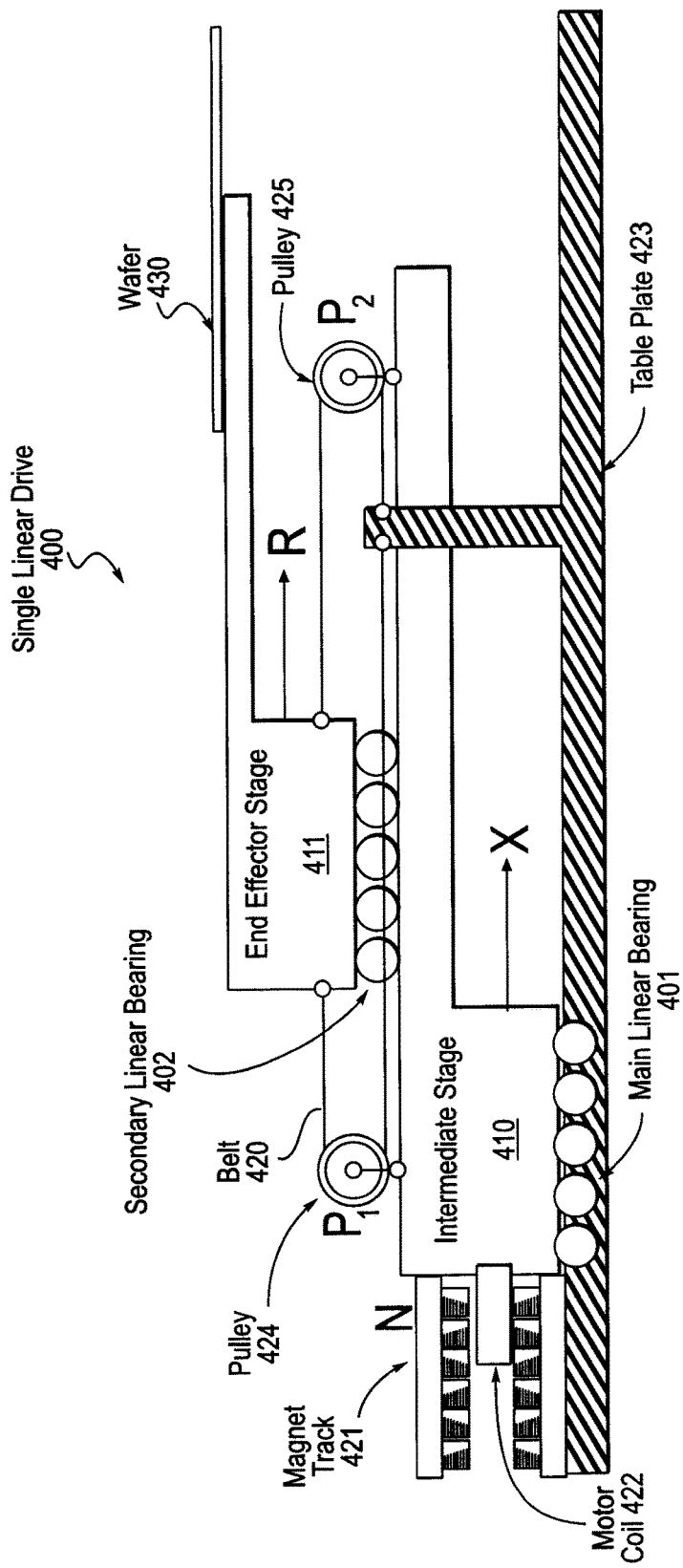
FIG. 4 illustrates a schematic diagram of an exemplary single linear drive, according to one embodiment.

FIG. 4 illustrates a schematic diagram of an exemplary single linear drive, according to one embodiment. Upper extension 310 and lower extension 311 of linear drive 111 may utilize the single linear drive 400, but not limited thereto. The single linear drive 400 is an articulated mechanism, whereby the motion of the end-effector stage 411 is amplified two times that of the intermediate stage 410. The amplification is achieved by moving the end-effector stage 410 via the belt 420 which is stretched between the two pulleys 424 and 425. This articulation design guarantees a 1:2 ratio between the motions of the intermediate stage 410 and the end-effector stage 411, represented by X and R coordinates respectively. According to one embodiment, intermediate stage 410 is driven by a linear motor represented with magnet track 421 and motor coil 422. The linear motor is mounted on the intermediate stage 410, hence moves with it. Intermediate stage 410 glides on the table plate 423 with main linear bearing 401. Secondary linear bearing 402 imparts the articulated motion to the end-effector stage 411 attached to a set of two bearing blocks that ride the secondary bearing rail. A linear encoder (not shown) is attached to the intermediate stage 410 to provide the position feedback for the motion control. An auxiliary encoder may be attached to the end-effector stage 411 for higher-resolution applications.

Figure 5A:
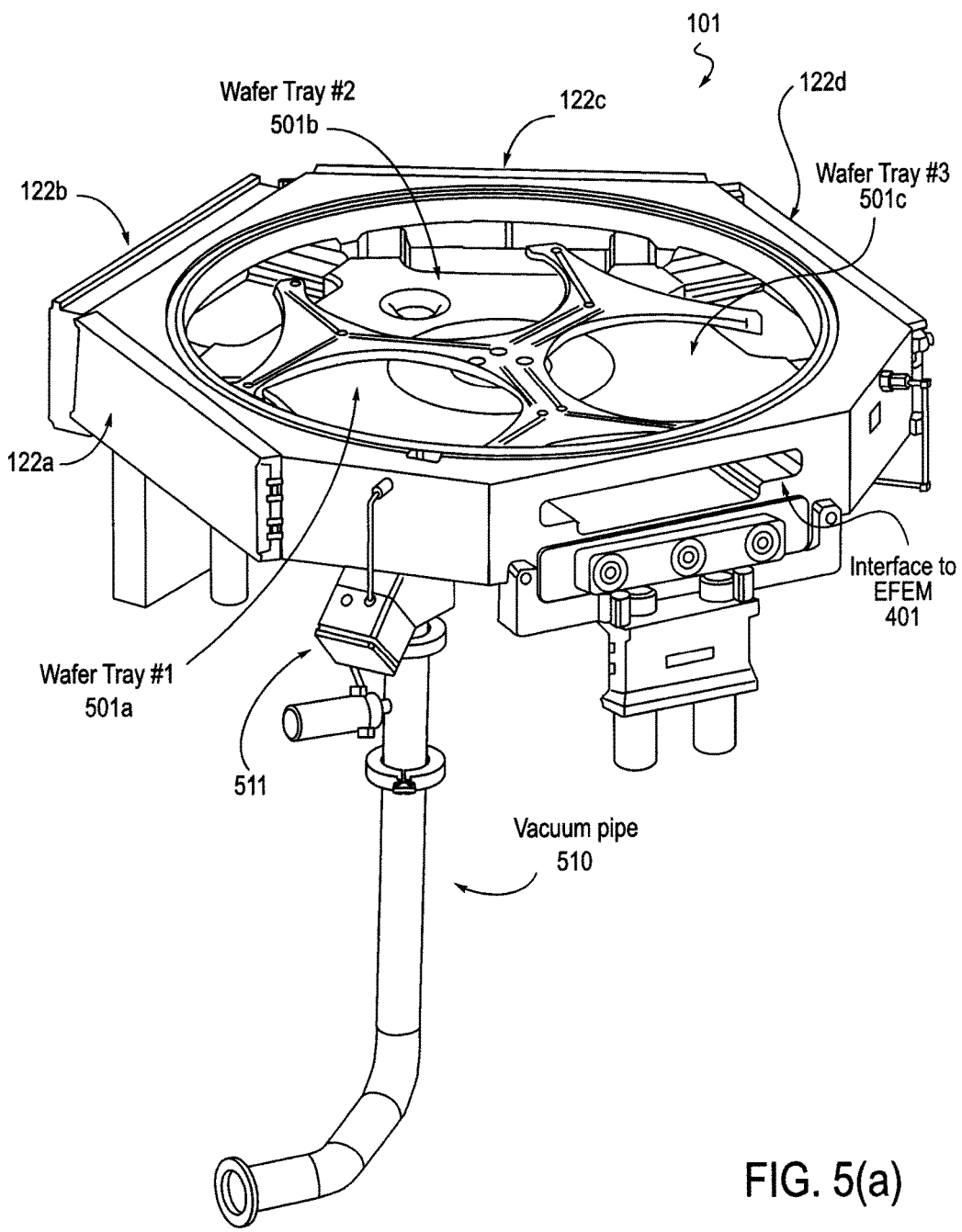
FIGS. 5(a) and 5(b) illustrate an exemplary wafer transfer station, according to one embodiment.
Figure 5B:
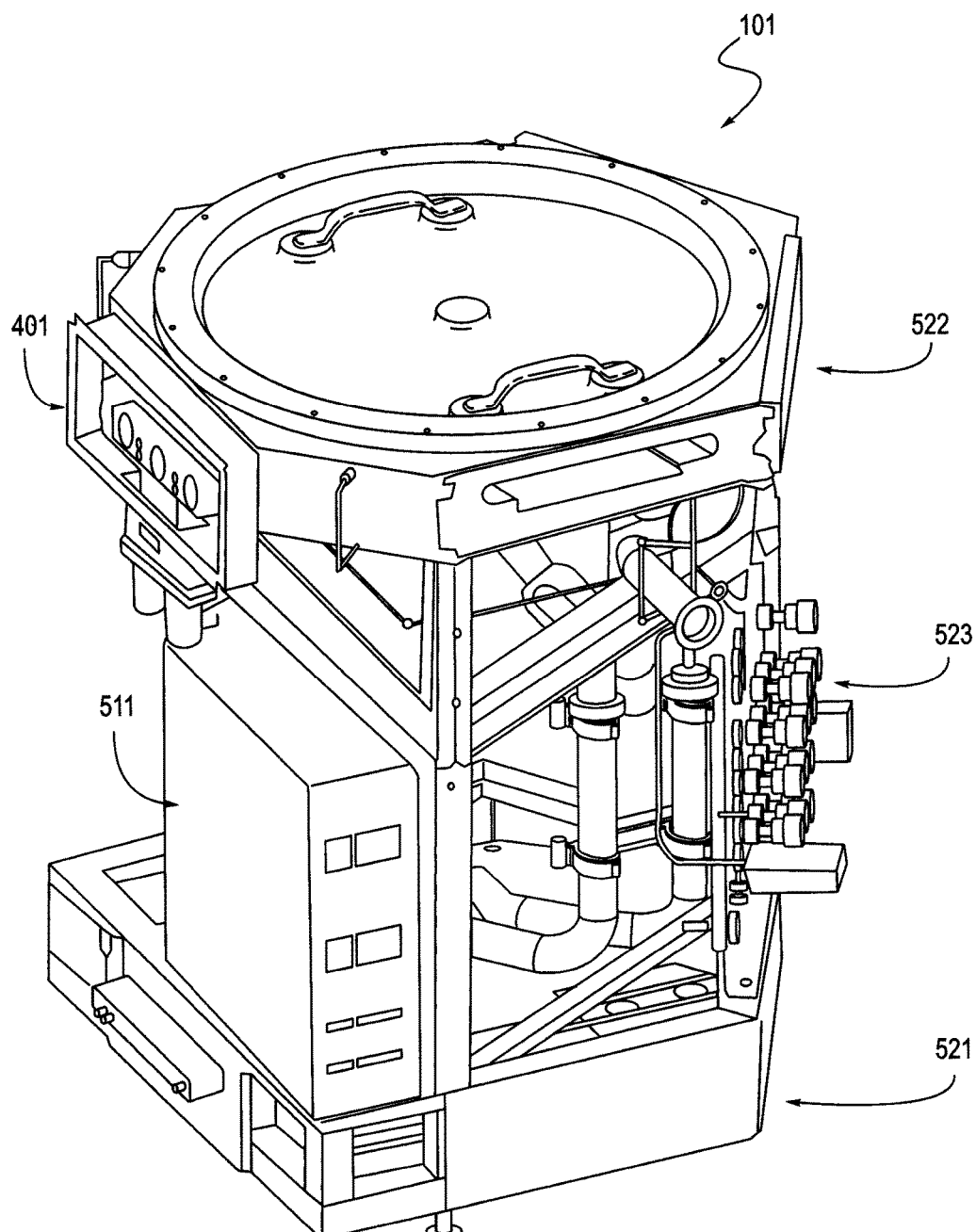

According to one embodiment, the wafer transfer station 101 functions as a wafer buffer as well as a load-lock. The wafer transfer station 101 holds multiple wafers simultaneously to transfer to and from multiple linear wafer drives 111 and/or another wafer transfer station. FIGS. 5(a) and 5(b) illustrate an exemplary wafer transfer station, according to one embodiment. The exemplary wafer transfer station 101 has a chamber that interfaces to four linear wafer drives 111 and one EFEM. For the purpose of illustration, wafer transfer station 101 holds up to six wafers on a rotational drive mechanism. Six wafers are stacked on two layers of wafer trays 501 and, each wafer tray 501 holds three wafers, so that only the top layer containing three wafers, wafer #1, #2 and #3, is visible. According to one embodiment, more wafers in more layers (e.g., four wafer trays in three layers) can be considered depending on the system configuration and requirements. For example, the processing time of the attached processing modules 112 to the wafer transfer station 101 via linear wafer drives 111 determines the optimal numbers of wafers and layers of wafers. When the processing time is relatively longer, the more wafers and layers can be stacked and queued within the wafer transfer station 101 to increase the throughput of the system. Wafer transfer station 101 also interfaces with an EFEM via 401 to load and unload wafers stored in wafer cassettes. It also includes a plurality of slot valves 122 and a vacuum isolation valve 511 to control the vacuum level of the chamber.

Wafer transfer station 101 includes a Z-drive and a rotational drive (both not shown) to provide an indexed positioning in Z-direction as well as in a rotational degree of freedom. Using the Z-drive and the rotational drive, wafer transfer station 101 can place each wafer to interface with any linear wafer drive 111 attached thereto. According to one embodiment, the Z-drive and the rotational drive are positioned outside of wafer transfer station 101 and are coupled to make an assembly. A ferro-fluidic seal or any other type of seals may be used around the vertical shaft of the assembly to isolate the chamber of wafer transfer stations 101 from atmospheric pressure and the attached linear wafer drives 111. The placement of the Z-drive and the rotational drive outside wafer transfer station 101 is advantageous in many respects; the chamber of wafer transfer station 101 is made smaller so that the time to regulate the chamber's pressure is shortened, and less particles are generated within the chamber.

The design of the wafer transfer station 101 significantly improves the throughput of the system in comparison with conventional wafer transfer mechanisms driven by a SCARA robot. A conventional wafer transfer station is equipped with one or more SCARA robots to transfer wafers to and from an EFEM. Since the SCARA robot has an arm that can transfer only one wafer at a time, the throughput of the cluster tool remains slow due to such limitation despite other improvements of the cluster tool. In contrast, the wafer transfer station 101 can access multiple linear wafer drives simultaneously due to the independent operation of linear and rotational drives, thereby improving the throughput of the cluster tool.

The wafer transfer station 101, according to one embodiment, consists of multiple submodules the frame assembly 521, the chamber assembly 522, the rotational mechanism, the wafer hub assembly, the $N_2$ distribution system 523, the clear dry air (CDA) distribution system, the power distribution system 511, the vacuum distribution system and the control system including an equipment controller 121.

According to one embodiment, the frame assembly consists of a welded, powder-coated tubular steel frame with facility interfaces, as well as structural support and mounting features which facilitates assembly of the other submodules. The vacuum chamber is a machined aluminum block with tunnel features at five radial positions for transferring wafers. A round pressure-resistant cover seals an opening on the top surface and provides service access to the mechanisms inside. Additionally, there are openings on the bottom for the rotational mechanism, for a pressure-sensing unit and for the vacuum distribution system. On one side of the chamber, there are optical feed through ports for two wafer presence sensors. The rotational mechanism and the wafer hub assembly provide a theta-rotational buffering station with a two-layer times three-column array of wafer storage locations. The $N_2$ distribution system provides a controlled flow of nitrogen gas for venting the wafer transfer station 101, as well as a separate manifold providing dedicated nitrogen vent gas for any linear wafer drives 111, which may be connected. The CDA distribution system provides the supply and control of compressed air for operating pneumatically-controlled valves used in both the wafer transfer station 101 and linear wafer drives 111. The power distribution system 511 converts the factory electrical input voltage (e.g., 208 VAC, 380 VAC) to controlled DC voltages (e.g., 12 VDC, 24 VDC) for the wafer transfer-station 101, linear wafer drives 111 and other electronic components of the cluster tool. The vacuum distribution system provides controlled access to the vacuum for both the wafer transfer station 101 and any connected linear wafer drives 111. Vacuum lines for the wafer transfer station 101 and linear wafer drives 111 are isolated from each other for optimal operation and for the avoidance of cross-coupling. The control system consists of an equipment controller 121e and a transport module controller 131 which controls the operation of other equipment controllers controlling attached linear wafer drives 111.

According to one embodiment, the wafer transfer station 101 is tetragonal in shape; however, it is understood that the configuration of the wafer transfer station is not limited to such a configuration triangular, rectangular, hexagonal shapes, and so on are possible and the present embodiments are not limited.

FIGS. 6(*a*) and 6(*b*) illustrate a block diagram of an exemplary equipment controller, according to one embodiment. According to one embodiment, equipment controllers 121 controlling either wafer transfer station 101 or linear wafer drive 111 are identical in design for cost saving and enhanced maintainability. Equipment controller 121 can be easily configured by a configuration software or a DIP switch to function as desired.

FIG. 6(*a*) illustrates an exemplary equipment controller 121 including single-board computer 501, I/O interface board 502, and motor interface board 503. Single-board computer 501 includes a microprocessor and slots for memory 510 and storage 511. Storage 511 might be an SD card, micro SD card, Compact Flash card, memory stick, micro hard drive, or any other type of storage media. Storage 511 may store a boot loader, a lean software program that automatically runs at boot-up, a second image of the boot loader, system-specific recipes, proprietary system configuration data, licenses, diagnostic utility or user-editable programs provided by the manufacturer or the system user. The second image of the boot loader provides a factory reset if the original boot loader is corrupted or damaged. I/O interface board 502 connects various types of input and output devices via numerous communication protocols. I/O interfaces such as pneumatic I/O 520, analog I/O 521, and digital I/O 522 are also controlled by the main program running on the single-board computer 501. Various communication ports are supported, such as IEEE 1394 FireWire 523, JTAG 524, Ethernet 525, RS232 526, USB 527, and serial port 528. JTAG 524, also known as IEEE 1149.1 standard, is particularly useful when performing debugging and diagnostics of the equipment controller 121. Equipment controller 121 connects to transport module controller 131 via Ethernet 525, according to one embodiment. Keyboard/monitor interface 529 is particularly useful when debugging during the development cycle and diagnosing the system in the field. Single-board computer 510 connects to I/O interface board 502 to access the I/O and communication devices, or, depending on the design of the single-board computer 501, it can directly access the I/Os and communication devices by internal configuration. Motor interface board 503 controls up to four axes attached to the equipment controller 112. Motors 550-553 may be equipped with internal or external encoders. Encoder signals from motors 550-553 are fed back to the motor interface board 531, then to the main program to provide feedback control of the motors. Amplifiers 540 provides the required current to produce adequate torques to the motors 550-553. A safety mechanism may be integrated into the motor interface board or is controlled by the main control program running on the single-board computer 501.

The types of numbers of I/Os and communication ports/devices are shown for illustrative purposes only, therefore the actual design of the equipment controller 121 may or may not include these devices depending on the design. Nevertheless, the types and the numbers of I/Os and communication devices are configurable.

FIG. 6(b) illustrates another exemplary equipment controller 121, according to one embodiment. Single board computer 501 interfaces with a motion controller 511, which incorporates many features such as I/O interlinks 504 and I/O interfaces 502 as well as multi-axes motion control through motor interface board 503. For saving the development cost and scalability in design, motion controller 511 may be a commercially available motion controller, for example, PMD Prodigy manufactured by Performance Motion Device, Inc. of Lincoln, Mass.

Figure 7:
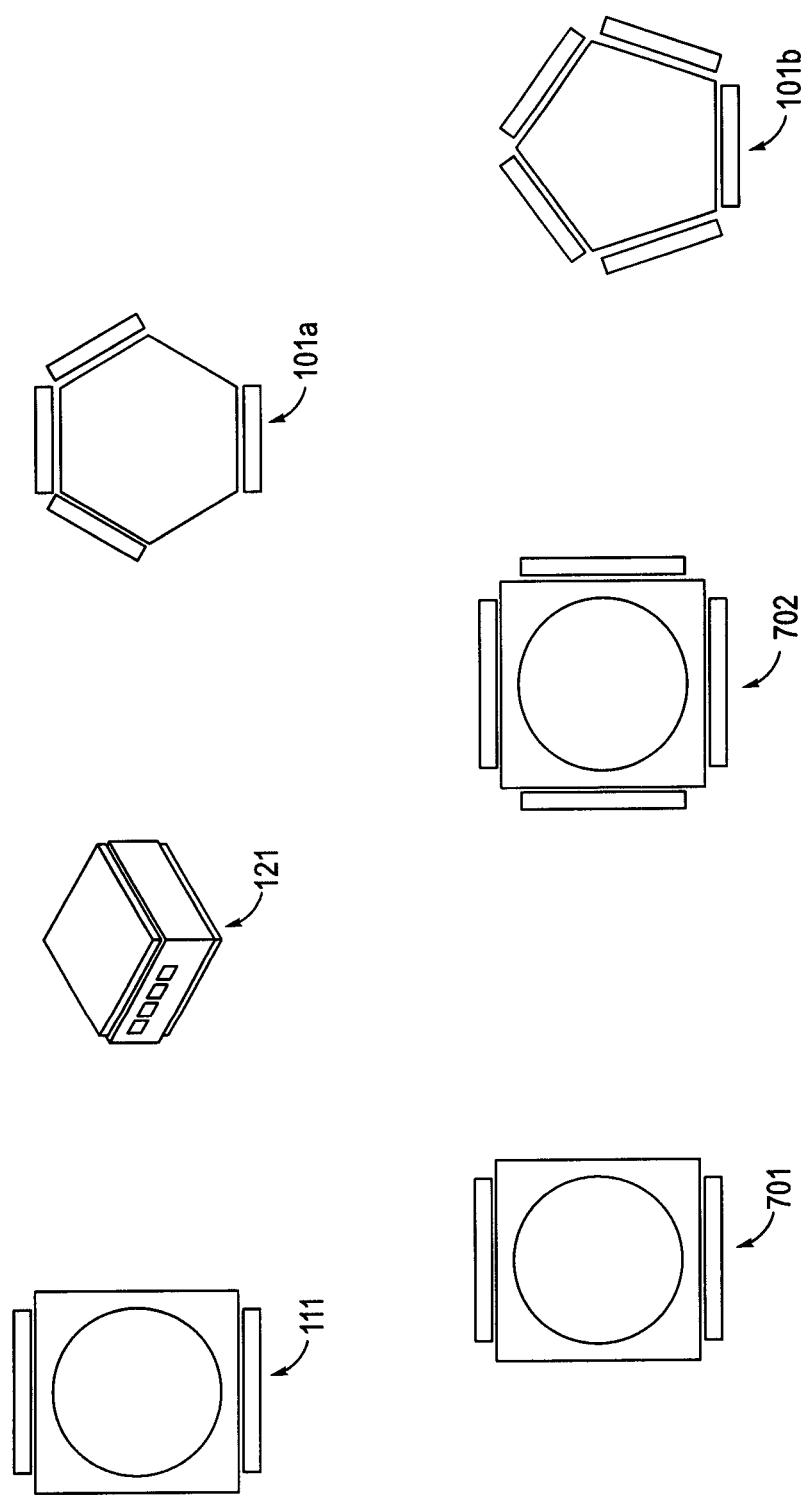
FIG. 7 illustrates exemplary subsystems or components used to configure a modular cluster tool system, according to one embodiment.

FIG. 7 illustrates exemplary subsystems or components used to configure a modular cluster tool system 100, 800 or 900, according to one embodiment. Linear wafer drives 111 and wafer transport station 101 are characterized as active components for their ability to transport wafers. Dual wafer load-lock 701 and multi-wafer buffer 702 are passive components that are used to connect one or more active components. Passive components are characterized for not including an active wafer transport mechanism, but are capable of performing functions that do not require a wafer transport mechanism such as load-locks or wafer buffers. Dual wafer load-lock 701 is similar to linear wafer drivel 111 in configuration but is coupled to an active components having a wafer drive mechanism such that wafers can be transported in and out of the dual wafer load-lock 701. Using a finite number of subsystems such as the ones shown in FIG. 7, a modular cluster tool system can be easily reconfigured to meet the needs and requirements of the system.

Figure 8:
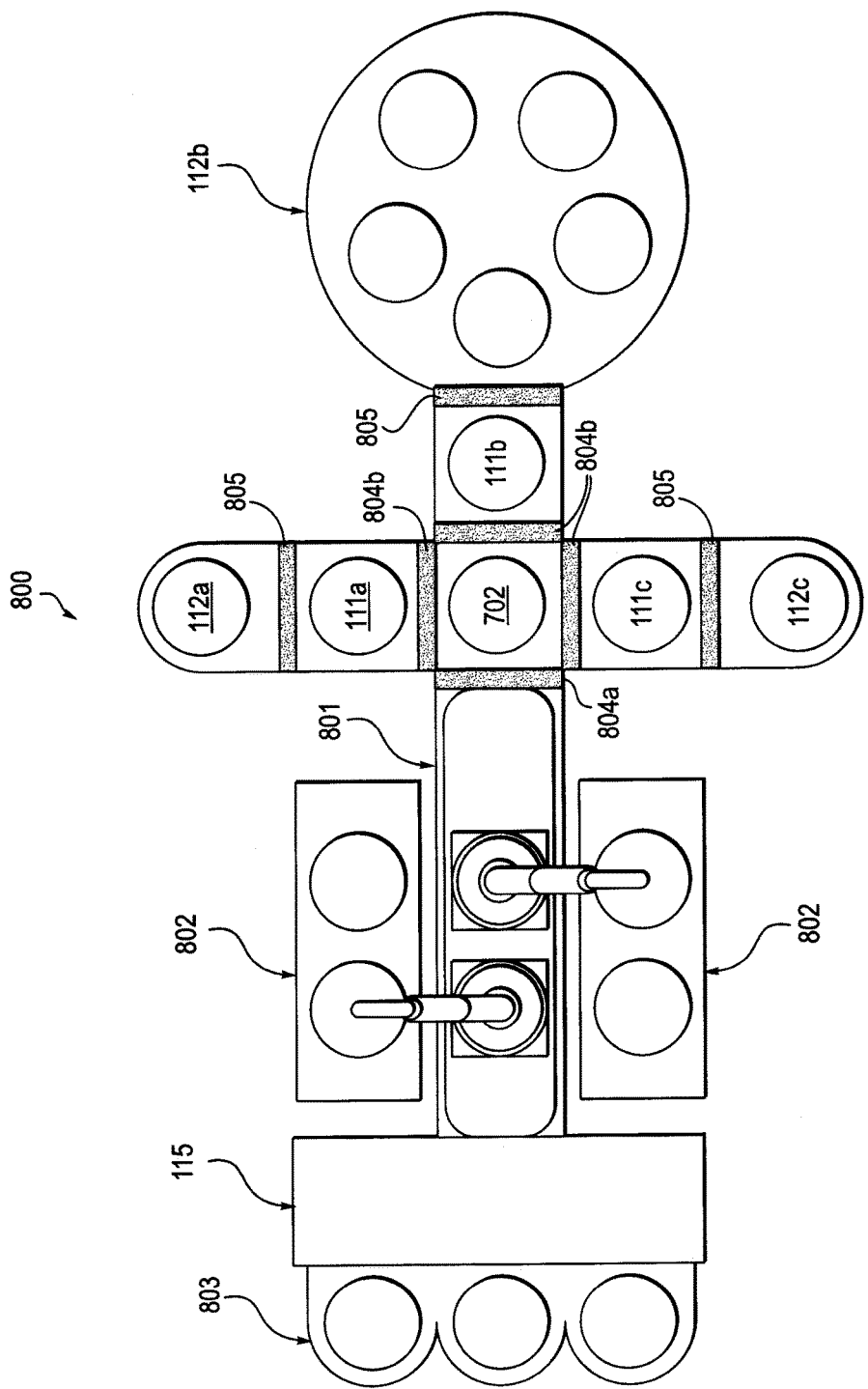
FIG. 8 illustrates an exemplary modular cluster tool system incorporating more than one component, according to one embodiment.

FIG. 8 illustrates an exemplary modular cluster tool system 800 incorporating more than one component, according to one embodiment. Wafers in FOUPs 803 are loaded into the modular cluster tool system 800 via EFEM 115. The wafers are thereafter transported to and processed at atmospheric process modules 802 via track robot 801 before entering multi-wafer buffer 702. In the case that atmospheric processes are not integrated in the modular cluster tool system 800, track robot 801 may be substituted with a wafer transfer station 101a or 101b. Multi-wafer buffer 702 is a load-lock stacking multiple wafer therein. After the wafers are stacked in multi-wafer buffer 702, slit valves 804 are closed and the chamber of multi-wafer buffer 702 is pumped down to a desire vacuum level. After the desired vacuum level is reached, multi-wafer buffer 802 opens slit valves 804b to transfer wafers to the three adjacent linear wafer drives 111. The vacuum level in the adjacent linear wafer drives 111 may be further controlled prior to opening slit valves 805 that is located between the linear wafer drives 111 and the wafer processing modules 112.

Modular cluster tool system 800 is advantageous over conventional cluster tools because the transportation of multiple wafers is distributed by multiple wafer drive mechanisms. Even if one linear wafer drive 111 fails, the other linear wafer drives 111 still operate to transport wafers to the processing modules 112 connected thereto. In contrast, if a central robot is used to distribute all the wafers entering the cluster tool system, the failure of the central robot completely stops the transportation of wafers therein. Furthermore, the more processing modules 112 are integrated into the cluster tool system, the throughput of the cluster tool system is disproportionally affected since the central robot can only handle limited numbers of wafers at a given time. In contrast, modular cluster tool system 800 distributes the load of wafer transportation to multiple linear wafer drives 111 thus the throughput is proportionally increased with more processing modules. In one embodiment, each linear wafer drive 111 is coupled to each processing module 112. The transportation of wafers into a processing module 112 is dependent on the coupled linear wafer drive 111. The throughput is further increased with dual linear wafer drive mechanisms 34 and 311 as explained earlier. The exemplary configuration of modular cluster tool system 800 achieves independent operation of multiple processing modules 112 and resultantly increases the overall through put of the system. For example, if linear wafer drive 111b fails, wafers may not be processed at processing module 112b, but can still be processed in other processing modules 112a and 112c.

Figure 9:
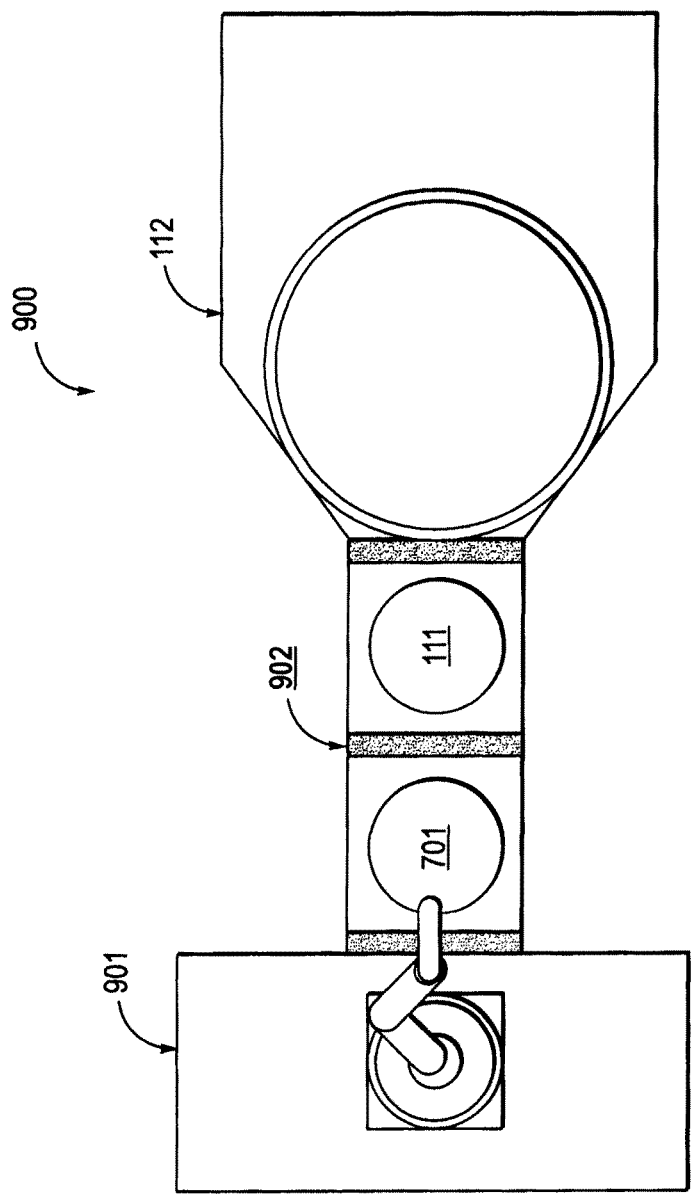
FIG. 9 illustrates an exemplary modular cluster tool system incorporating a dual wafer load-lock and a linear wafer drive, according to one embodiment.

FIG. 9 illustrates an exemplary modular cluster tool system 900 incorporating a dual wafer load-lock and a linear wafer drive according to one embodiment. The exemplary modular cluster tool system 900 illustrates the usage of a passive component connected to one or more active components. A wafer handling robot 901 in an EFEM and a linear wafer drive 111 are connected to dual wafer load-lock 701 on each side. A wafer is firstly transported from wafer handling robot 901 into dual wafer load-lock 701, and the chamber of the dual wafer load-lock 701 is pumped down to a desired vacuum level. Subsequently, slit valve 902 connecting dual wafer load-lock 701 and linear wafer drive 111 opens, and a linear extension of the linear wafer drive 111 reaches the inside of dual wafer load-lock 701 to grasp the wafer and transport it into processing chamber 112. Passive components of modular cluster tool system 900, such as dual wafer load-lock 701, do not incorporate a wafer drive mechanism therein, but are useful for connecting one or more active component such as linear wafer drives 111 or wafer handling robots 901.

Modular cluster tool system 900 may be used for the development of a semiconductor process. Typical process development systems does not require a full-blown semiconductor cluster tool system that is used in a semiconductor production line. Instead, reconfigurable subsystems as shown in FIG. 7 may be used to construct a custom process development system tailored for the need of a processor developer. By building a modular cluster tool with reconfigurable subsystems and reconfiguring the modular cluster tool based on the need, a cost saving for a semiconductor process development is expected.

It is noted that various designs or configurations of modular cluster tool components may be considered without deviating from the scope of the present subject matter. The present methods and systems provide modular cluster tool components, including both active and passive components, to build a modular cluster tool in various configurations and designs.

We claim:

1. A linear drive assembly, comprising:
an enclosure having a base plate, the enclosure having:
   a first end effector for holding a semiconductor wafer in a first plane above the base plate;
   a second end effector for holding a semiconductor wafer in a second plane that is above the first plane, the first and second end effectors configured to move in a common linear direction independently from each other, each of the first and second end effectors includes:
      (a) an intermediate stage to be driven in the common linear direction;
      (b) an end effector stage supported over and located above a surface of the intermediate stage;
      (c) a first bearing between the intermediate stage and the end effector stage to articulate a horizontal movement of the end effector stage with respect to the intermediate stage;
      (d) a first pulley and a second pulley connected to the intermediate stage, such that the first and second pulleys move with the intermediate stage when the intermediate stage is driven, wherein the first bearing is located between the first pulley and the second pulley to articulate the horizontal movement of the end effector stage with respect to the intermediate stage;
      (e) a belt located around the first pulley and the second pulley, wherein the belt is coupled to a first side of the end effector stage and is fixed relative to the base plate, wherein the belt is further coupled to a second side of the end effector stage, wherein a portion of the end effector stage is attached to the belt between the first pulley and the second pulley to move in the common linear direction between the first pulley and the second pulley;
      wherein the intermediate stage is configured to move horizontally in the common linear direction to articulate the horizontal movement the end effector stage in the common linear direction, wherein the first and second pulleys and the belt cause the end effector stage to amplify the horizontal movement of the end effector stage in the common linear direction, relative to the horizontal movement of the intermediate stage in the common linear direction.

2. The linear drive assembly as recited in claim 1, further comprising:
a rotational drive connected to the base plate, the rotation drive enabling the first end effector and the second end effector to rotate between zero and 180 degrees.

3. The linear drive assembly of claim 1, wherein each of the first and second end effectors includes:
a second bearing between the intermediate stage and the base plate;
wherein the first and second bearings facilitate the respective horizontal movements of the intermediate stage and the end effector stage in the common linear direction.

4. The linear drive assembly of claim 1, wherein the first and second pulleys and the belt are sized to define a degree of amplification of the horizontal movement of the end effector stage, relative to the horizontal movement of the intermediate stage.

5. The linear drive assembly of claim 4, wherein the degree of amplification is two times, such that for a unit of the horizontal movement of the intermediate stage two units of the horizontal movement of the intermediate stage are imparted to the end effector stage.

6. The linear drive assembly of claim 1, further comprising:
a vertical drive, the vertical drive including a member that extends within the enclosure to vertically move the first end-effector and the second end-effector to indexed positions.

7. The linear drive assembly of claim 1, further comprising:
an equipment controller that controls a plurality of movements of the first end effector, controls a plurality of movements of the second end effector, controls a rotational drive, and controls a vertical drive, the movements of the first end effector include a rotational movement, a vertical movement, and the horizontal movements.

8. The linear drive assembly of claim 1, wherein the belt is coupled to the end effector stage between the first and second pulleys, wherein the belt is fixed relative to the base plate between the first and second pulleys.

9. A linear drive assembly, comprising:
an end effector for holding a semiconductor wafer in a plane above a base plate and configured to move in a common linear direction, the end effector includes:
   (a) an intermediate stage to be driven in the common linear direction;
   (b) an end effector stage supported over and located above a surface of the intermediate stage;
   (c) a first bearing between the intermediate stage and the end effector stage to articulate a horizontal movement of the end effector stage with respect to the intermediate stage;
   (d) a first pulley and a second pulley connected to the intermediate stage, such that the first and second pulleys move together with the intermediate stage when the intermediate stage is driven, wherein the first bearing is located between the first pulley and the second pulley to articulate the horizontal movement of the end effector stage with respect to the intermediate stage;
   (e) a belt located around the first pulley and the second pulley, wherein the belt is coupled to a first side of the end effector stage and is fixed relative to the base plate, wherein the belt is further coupled to a second side of the end effector stage, wherein a portion of the end effector stage is attached to the belt between the first pulley and the second pulley to move in the common linear direction between the first pulley and the second pulley,
      wherein the intermediate stage movement is configured to move horizontally in the common linear direction to articulate the horizontal movement the end effector stage in the common linear direction, wherein the first and second pulleys and the belt cause the end effector stage to amplify the horizontal movement of the end effector stage in the common linear direction, relative to the horizontal movement of the intermediate stage in the common linear direction.

10. The linear drive assembly as recited in claim 9, further comprising:

a rotational drive connected to the base plate, the rotational drive enabling the end effector to rotate between zero and 180 degrees.

11. The linear drive assembly of claim 9,
wherein the end effector includes:
a second bearing between the intermediate stage and the base plate;
wherein the first and second bearings facilitate the respective horizontal movements of the intermediate stage and the end effector stage in the common linear direction.

12. The linear drive assembly of claim 9, wherein the first and second pulleys and the belt are sized to define a degree of amplification of the horizontal movement of the end effector stage, relative to the horizontal movement of the intermediate stage.

13. The linear drive assembly of claim 12, wherein the degree of amplification is two times, such that for a unit of the horizontal movement of the intermediate stage two units of the horizontal movement of the intermediate stage are imparted to the end effector stage.

14. The linear drive assembly of claim 9, further comprising:
a vertical drive, the vertical drive including a member that extends within the enclosure to vertically move the end effector to indexed positions.

15. The linear drive assembly of claim 9, further comprising:
an equipment controller that controls a plurality of movements of the end effector, controls a rotational drive, and controls a vertical drive, the movements of the first end effector include a rotational movement, a vertical movement, and the horizontal movements.

16. The linear drive assembly of claim 9, further comprising:
a second end effector connected to the base plate and defined vertically above the end effector, the second end effector configured to extend along the common linear direction.

17. The linear drive assembly of claim 16, wherein each of the end effector and the second end effector move in directions opposite each other in the common linear direction.

18. The linear drive assembly of claim 9, wherein the belt is coupled to the end effector stage between the first and second pulleys, wherein the belt is fixed relative to the base plate between the first and second pulleys.

* * * * *